United States Patent [19]

Kashida et al.

[11] Patent Number: 4,779,276
[45] Date of Patent: Oct. 18, 1988

[54] DATA TRANSMISSION SYSTEM

[75] Inventors: Motokazu Kashida, Tokyo; Shinichi Yamashita, Kanagawa; Naoto Abe, Kanagawa; Makoto Shimokoriyama, Kanagawa; Masahiro Takei, Kanagawa; Koji Takahashi, Kanagawa, all of Japan

[73] Assignee: Canon Kabushiki Kaisha, Tokyo, Japan

[21] Appl. No.: 890,831

[22] Filed: Jul. 25, 1986

[30] Foreign Application Priority Data

| Jul. 30, 1985 | [JP] | Japan | 60-169040 |
| Jul. 31, 1985 | [JP] | Japan | 60-169420 |
| Dec. 23, 1985 | [JP] | Japan | 60-291172 |

[51] Int. Cl.⁴ ............................................. G06F 11/10
[52] U.S. Cl. ......................................... 371/57; 371/37
[58] Field of Search ........................ 371/37, 38, 39, 40, 371/2, 57

[56] References Cited

U.S. PATENT DOCUMENTS

| 3,227,999 | 1/1966 | Hagelbarger | 371/37 |
| 3,571,794 | 3/1971 | Tong | 371/40 |
| 3,585,586 | 6/1971 | Harmon et al. | 371/2 |
| 3,657,699 | 4/1972 | Rocher et al. | 371/2 |
| 3,840,854 | 10/1974 | Franaszek | 371/57 |
| 4,238,852 | 12/1980 | Iga et al. | 371/40 |
| 4,320,510 | 3/1982 | Kojima | 371/37 |
| 4,398,292 | 8/1983 | Doi et al. | 371/39 |
| 4,414,659 | 11/1983 | Beckers | 371/57 X |
| 4,597,083 | 6/1986 | Stenerson | 371/37 |

Primary Examiner—Charles E. Atkinson
Attorney, Agent, or Firm—Robin, Blecker & Daley

[57] ABSTRACT

A data transmission system operative to transmit data with a reduced low band frequency component includes facility for processing a predetermined quantity of information data, such as a code word, for generating error detecting-correcting data, and for dispersing the latter data in the former data. In one practice for effecting the dispersion, the system divides the information data and the error detecting-correcting data into respective groupings, and disperses the latter grouping into the former grouping. The resulting signal is transmitted.

23 Claims, 11 Drawing Sheets

F I G. 1 (PRIOR ART)

| SYNCHRONI-ZING DATA | INFORMATION DATA | ERROR DETECTING-CORRECTING CODE |
|---|---|---|

F I G. 2 (PRIOR ART)

| SYNCHRONI-ZING DATA | INFORMATION DATA | INNER CODE CHECK DIGIT |
|---|---|---|
| SYNCHRONI-ZING DATA | INFORMATION DATA | INNER CODE CHECK DIGIT |
| SYNCHRONI-ZING DATA | OUTER CODE CHECK DIGIT | INNER CODE CHECK DIGIT |

FIG. 3

| SYNCHRONIZING DATA | INFORMATION DATA | CHECK DIGIT 1 | INFORMATION DATA | CHECK DIGIT 2 | INFORMATION DATA | ~ | INFORMATION DATA | CHECK DIGIT n |

FIG. 4

| 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|
| $D_1$ | $D_2$ | $D_3$ | $P_1$ | $D_4$ | $D_5$ | $D_6$ | $P_2$ | $D_7$ | $D_8$ | $D_9$ | $P_3$ | $D_{10}$ | $D_{11}$ | $P_4$ |

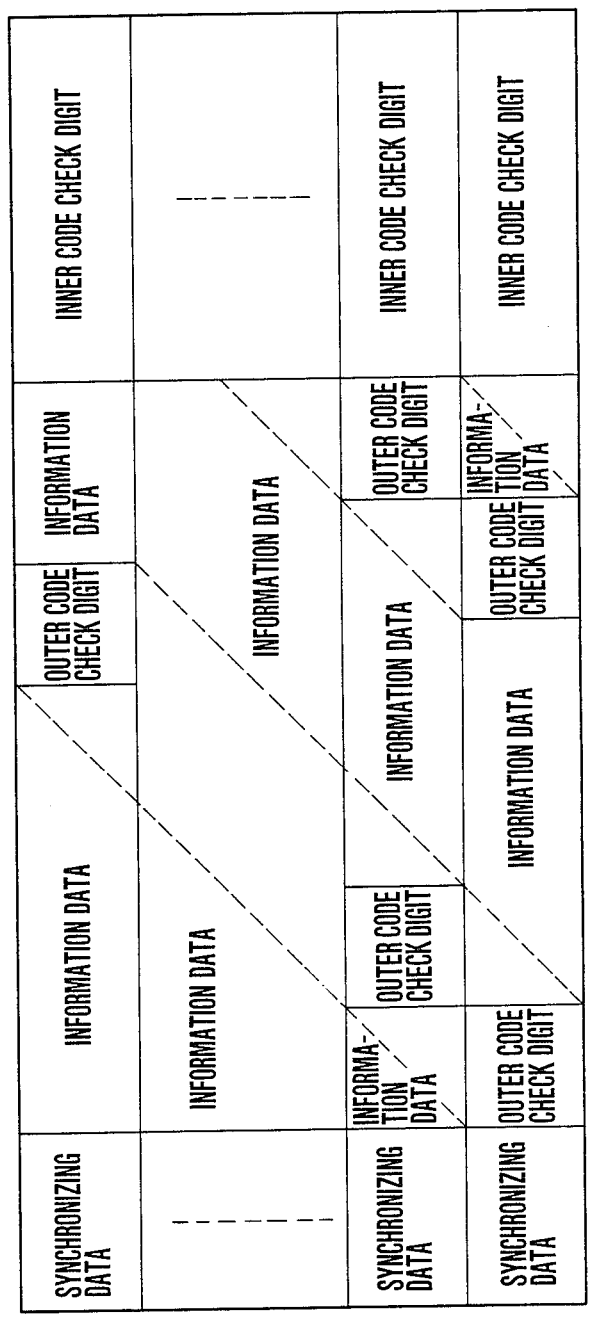
F I G.9

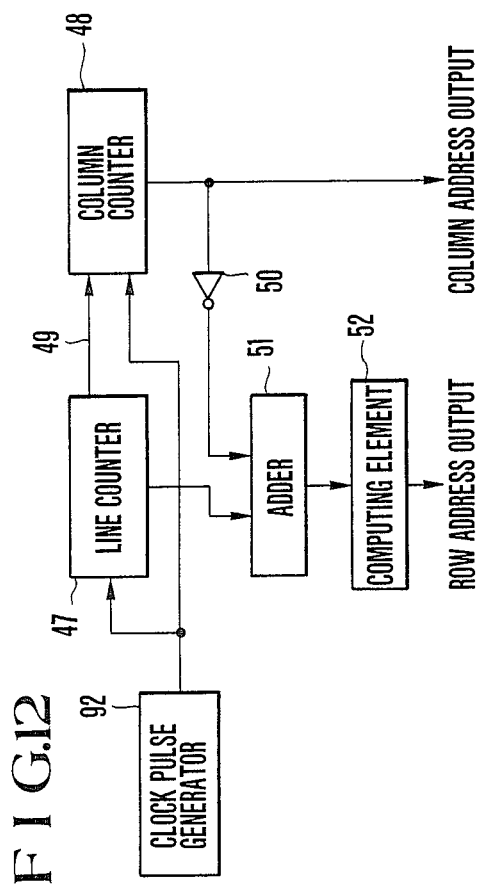
F I G. 12
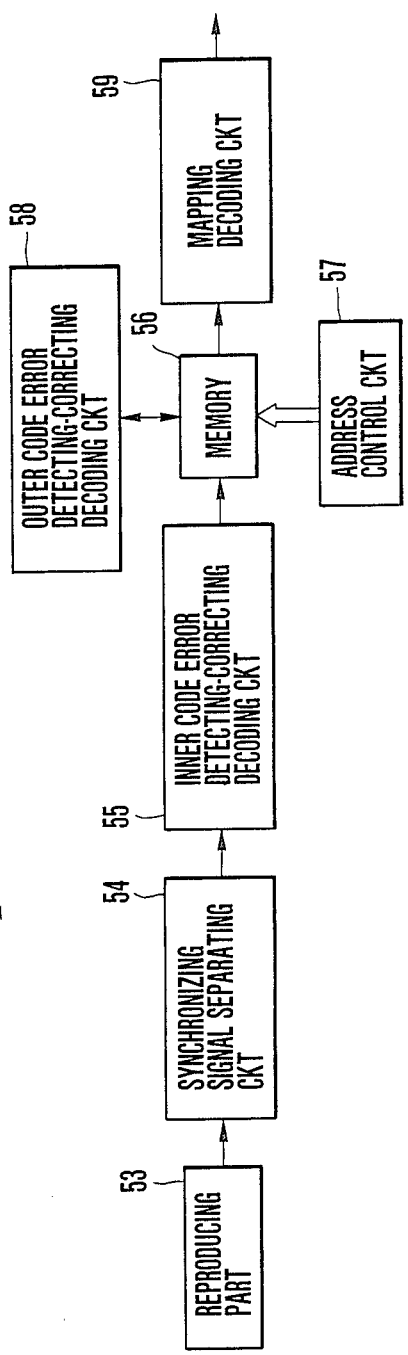
F I G. 13

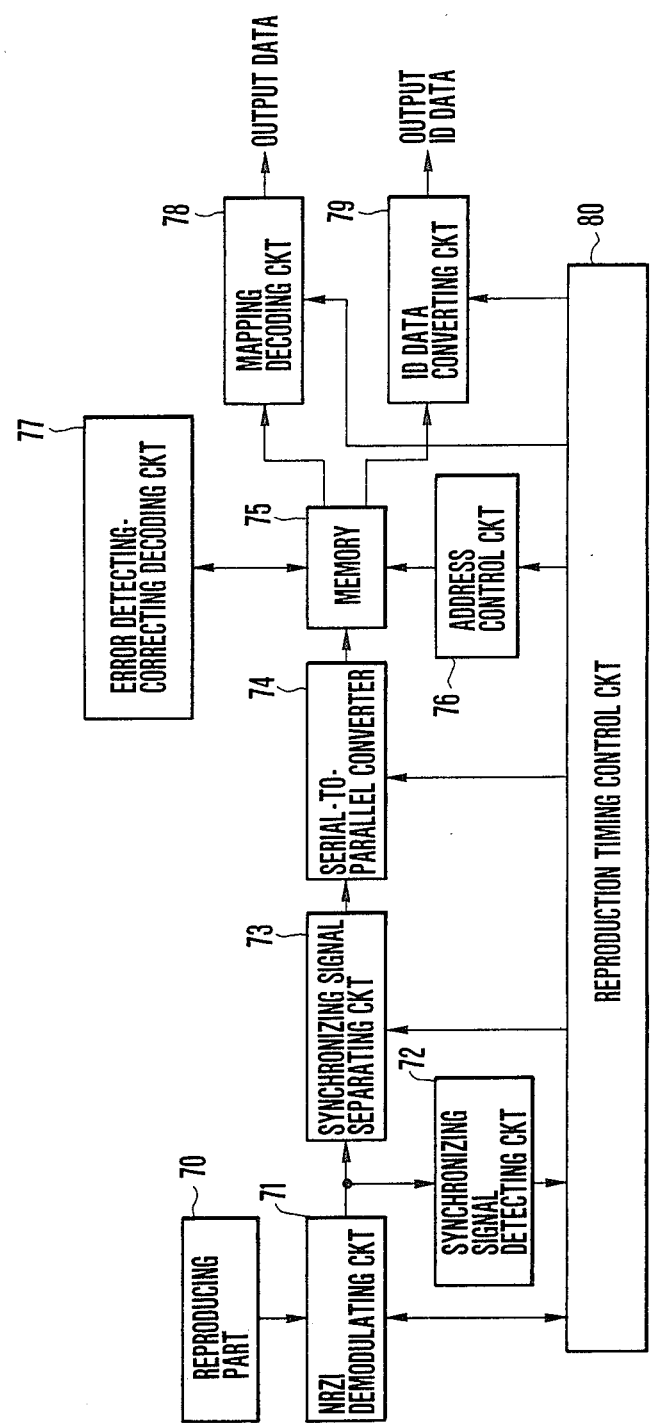
F I G. 16

DATA TRANSMISSION SYSTEM

BACKGROUND OF THE INVENTION

1. Field of the Invention

This invention relates to a data transmission system for transmitting binary information data.

2. Description of the Related Art

In transmitting a digital signal, one finds a pulse wave form having an extremely great amount of a low band frequency component if the input data consectively includes "1" or "0". If such digital data is, for example, to be recorded by a magnetic recording/reproducing apparatus such as a digital VTR, the low band frequency component would be cut off to make transmission difficult because of the use of a rotary transmitter. Then, it would increase the error rate of the data. Heretofore, in transmitting digital data, especially in the magnetic recording of a digital data signal or the like, practice has been to convert, for example, data of eight bits into data of nine bits (8/9 coding) for the purpose of suppressing the low band frequency component of the digital data signal to be recorded. In accordance with the above-stated 8/9 coding method, one redundant bit is added to every 8 bits. Therefore, while the low band component can be suppressed by that method, the redundancy of the signal increases.

Methods for avoiding the increase in redundancy include an n/n mapping coding method in which data of an n number of bits is converted into data of n bits. The n/n mapping coding method is applicable to a case where correlation is strong between adjacent data in terms of the statistical characteristic of the input signal. In accordance with this method, the low band frequency component of a coded data sequence is suppressed by utilizing this characteristic. More specifically, an incoming signal is difference coded. Differential data thus obtained shows a Laplace distribution converging in the neighborhood of zero of the positive and negative quantization levels. With this utilized, the low band component of a mapping coded data sequence is suppressed by converting the data sequence into a data sequence obtained with the DSV (digital sum value) of the data sequence selected as a parameter. This method includes, for example, a 4/4 mapping coding method in which input differential data of four bits is converted into data of four bits.

Further, with the level "1" of each bit in the bit pattern of data assumed to be "+1" and the level "0" to be "−1", the above-stated value DSV represents a total of bits within a single code. Accordingly, if the sum of bits of "1" is equal to that of the bits "0", the value DSV becomes zero. In this event, the data includes no DC component. The DC component of data increases according as the absolute value of DSV increases. In that event, the value DSV becomes a parameter showing the characteristic of the data.

While the low band frequency component of a coded data sequence thus can be suppressed without any increase in redundancy by mapping coding, the DC component cannot be completely removed by this method because of the n/n conversion ("n" represents a positive integer). Further, in case that some other additional information data, such as data for detecting and correcting error, is to be inserted in the coded data sequence, the low band suppressing effect attainable on the data sequence is greately lowered. As a result, the code error rate increases at the time of decoding.

FIG. 1 of the accompanying drawings shows an example of the arrangement of the conventional data frame. In FIG. 1, a part "information data" represents the abovestated mapping coded data sequence; "error detecting-correcting code" represents a check digit of, for example, a Hamming code, a Reed-Solomon code or the like.

With the data frame arranged as shown in FIG. 1, however, the low band suppressing effect on the data sequence greatly decreases in case that such checking information data as an error detecting-correcting code is inserted in the coded data sequence. Further, as a result of that, the code error rate increases at the time of demodulation.

FIG. 2 shows a case wherein a plurality of data frames each of which is arranged as shown in FIG. 1 and is provided with an inner code (row check code) are vertically aligned with an outer code (column check code) arranged in the vertical direction. The data frame arrangement thus, as a whole, forms a product code. Since this is a two-dimensional arrangement of the information data and the check codes, it is suitable particularly for picture data. However, in the case of the arrangement of FIG. 2, there is no correlation between data at each part where the check digits of inner and outer codes continue on each other. The lack of correlation does not permit use of a mapping code. Therefore, the suppressing effect on the low band frequency component decreases to a great degree. In the case of a data frame consisting solely of the check digits of outer and inner codes in particular, the check digits become consecutive over an excessively long period of time. Then, the low band frequency component suppressing effect for a portion of the data sequence at of such a long consecutive part decreases greatly.

SUMMARY OF THE INVENTION

It is a general object of this invention to provide a data transmission system which is capable of solving the above-stated problems of the prior art.

It is a more specific object of this invention to provide a data transmission system which is capable of adding error detecting-correcting data with a simple arrangement and without excessively lowering the low band frequency component supressing effect mentioned in the foregoing.

Under this object, a data transmission system arranged according to this invention as an embodiment thereof to transmit information data in which a low band frequency component is suppressed comprises: error detecting-correcting data generating means which receives information data in a predetermined quantity, such as a code word, or more generally, an information data signal grouping, and generates error detecting-correcting data (error correcting-detecting data signal groupings) for the information data received; and error detecting-correcting data dispersing means which divides the information data and also the error detecting-correcting data and produces the divided information data and the divided error detecting-correcting data with the latter data dispersed in the former data.

It is another object of this invention to provide a data transmission system which is capable of transmitting information data by adding thereto error detecting-correcting data without lowering the low band frequency component suppressing effect and which is capable of reproducing or restoring the original data by detecting and correcting any error of data occurred during the process of transmission.

Under that object, a data transmission system arranged according to this invention as another embodiment thereof to transmit information data in which a low band frequency component is suppressed comprises: error detecting-correcting data adding means which receives information data in a predetermined quantity and dispersively adds, to an information data sequence containing such received information data quantity, error detecting-correcting data transmission means for transmitting such information data to which the error detecting-correcting data has been added; and error detecting and correcting means arranged to detect and correct any error in the information data by using the error detecting-correcting data dispersed in the information data sequence which has the error detecting-correcting data added thereto and has been transmitted by the transmission means.

It is a further object of this invention to provide a data transmission system which is capable of transmitting data by suppressing the low band frequency component thereof with a simple arrangement and without increasing redundancy.

Under this object, a data transmission system arranged according to this invention to transmit information data comprises: low band frequency component suppressing means which receives said information data and suppresses the low band frequency component thereof; first data adding means arranged to divide the low frequency band component suppressed information data into groups, each having a predetermined quantity of information, and to produce as a first information data group one of the divided groups by adding a data signal which is indicative of "0" to the head of the information data group; second data adding means arranged to add a data signal which is indicative of "1" to the head of another of the divided information data groups and to produce the group as a second information data group; converting means for converting each of the first and second information data groups into a signal representing a difference between the number of bits indicative of "0" and the number of bits indicative of "1" among second and subsequent bits within each group, the difference varying according to the content of data of a first bit within each group; adding means arranged to compute a difference between the number of data indicative of "0" and the number of data indicative of "1" within each of the first and second information data group after conversion by the converting means and to cumulatively add the difference between the number of data indicative of "0" and that of data indicative of "1" among information data transmitted; and output selection means for selecting either the first information data group or the second information data group obtained through conversion by the converting means, said selection being made according to the result of the adding operation by the adding means.

The above and further objects and features of this invention will become apparent from the following detailed description of preferred embodiments thereof taken in connection with the accompanying drawings.

BRIEF DESCRIPTION OF THE DRAWINGS

FIG. 1 is an illustration showing by way of example the arrangement of the conventional data frame.

FIG. 2 is an illustration of the conventional data frame arrangement in which an inner code is arranged as shown in the data frame of FIG. 1; and a plurality of such data frames are vertically arranged with an outer code vertically arranged to form a product code as a whole.

FIG. 3 shows a case where an error detecting-correcting code shown in FIG. 1 is divided into an "n" number of codes, which are dispersively allocated.

FIG. 4 shows by way of example code words assigned to data shown in FIG. 3.

FIG. 9 is an illustration showing by way of example the arrangement of a product code formed according to this invention.

FIG. 12 is a block diagram showing by way of example the arrangement of an address control circuit 42 included in the VTR of FIG. 11.

FIG. 13 is a block diagram showing in outline the arrangement of the reproducing system of the VTR of FIG. 11.

FIG. 16 is a block diagram showing in outline the arrangement of the reproducing system of the VTR of FIG. 16.

DETAILED DESCRIPTION OF THE PREFERRED EMBODIMENTS

Figure 5:
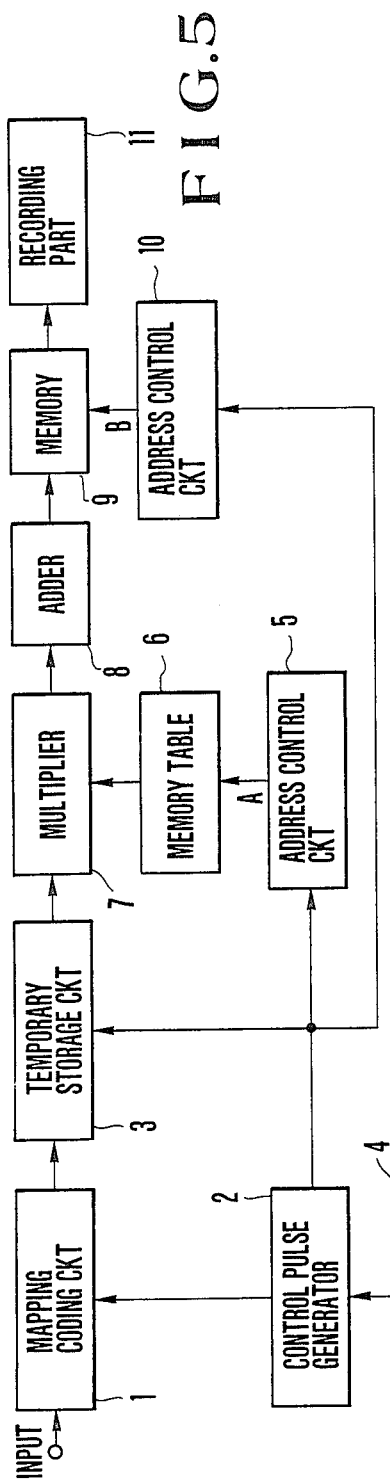
FIG. 5 is a block diagram showing in outline the arrangement of the recording system of a digital VTR to which this invention is applied as a first embodiment of this invention.

Before describing the embodiments of this invention, positions of check digits conventionally employed for detecting and correcting an error are described as follows: Here, an irreducible polynomial $X^4+X+1$ on a Galois field GF (2) is assumed to be a generator polynomial and, in a cyclic Hamming code (15, 11), the vector of the root $\alpha$ of $X^{15}-1$ is assumed to be (0010). A parity check matrix H for detecting and correcting an error in a code word in this instance can be expressed as follows:

$$H = |a^{14}\ a^{13}\ a^{12}\ a^{11}\ a^{10}\ a^9\ a^8\ a^7\ a^6\ a^5\ a^4\ a^3\ a^2\ a^1\ | \quad (1)$$

$$= \begin{vmatrix} 1 & 1 & 1 & 1 & 0 & 1 & 0 & 1 & 1 & 0 & 0 & 1 & 0 & 0 & 0 \\ 0 & 1 & 1 & 1 & 1 & 0 & 1 & 0 & 1 & 1 & 0 & 0 & 1 & 0 & 0 \\ 0 & 0 & 1 & 1 & 1 & 1 & 0 & 1 & 0 & 1 & 1 & 0 & 0 & 1 & 0 \\ 1 & 1 & 1 & 0 & 1 & 0 & 1 & 1 & 0 & 0 & 1 & 0 & 0 & 0 & 1 \end{vmatrix}$$

If Formula (1) is considered by dividing it into a unit matrix $I_4$ of $4 \times 4$ and the matrix P of other parts $4 \times 11$, the parity check matrix can be expressed as:

$$H = PI_4 \quad (2)$$

Then, the above-stated generator matrix G of the cyclic Hamming code (15, 11) satisfies a condition of $$GH^T = 0 \quad (3),$$

wherein "T" on the right shoulder of "H" is a symbol representing transposition of the matrix. The matrix G can be expressed as follows:

$$G = I_{11}P^T \quad (4)$$

$$= \begin{vmatrix} 1 & 0 & 0 & 0 & 0 & 0 & 0 & 0 & 0 & 0 & 1 & 0 & 0 & 1 \\ 0 & 1 & 0 & 0 & 0 & 0 & 0 & 0 & 0 & 0 & 1 & 1 & 0 & 1 \\ 0 & 0 & 1 & 0 & 0 & 0 & 0 & 0 & 0 & 0 & 1 & 1 & 1 & 1 \\ 0 & 0 & 0 & 1 & 0 & 0 & 0 & 0 & 0 & 0 & 1 & 1 & 1 & 0 \\ 0 & 0 & 0 & 0 & 1 & 0 & 0 & 0 & 0 & 0 & 0 & 1 & 1 & 1 \\ 0 & 0 & 0 & 0 & 0 & 1 & 0 & 0 & 0 & 0 & 1 & 0 & 1 & 0 \\ 0 & 0 & 0 & 0 & 0 & 0 & 1 & 0 & 0 & 0 & 0 & 1 & 0 & 1 \\ 0 & 0 & 0 & 0 & 0 & 0 & 0 & 1 & 0 & 0 & 1 & 0 & 1 & 1 \\ 0 & 0 & 0 & 0 & 0 & 0 & 0 & 0 & 1 & 0 & 0 & 1 & 1 & 0 & 0 \\ 0 & 0 & 0 & 0 & 0 & 0 & 0 & 0 & 0 & 1 & 0 & 0 & 1 & 1 & 0 \\ 0 & 0 & 0 & 0 & 0 & 0 & 0 & 0 & 0 & 0 & 1 & 0 & 0 & 1 & 1 \end{vmatrix}$$

By the matrix G, the code for detecting and correcting an error of a code word can be added to obtain a data frame arrangement as shown in FIG. 1. Further, in the matrix H, a matrix part $I_4$ corresponds to a check digit for the code word (or symbol) and another matrix part $I_{11}$ to an information digit of the code word.

However, in accordance with the arrangement of the data frame shown in FIG. 1, the error detecting-correcting code is continuously arranged while the information data is in the form of a mapping code. Thus, while the low band frequency component of the data is suppressed, the low band component of the error detecting-correcting code is not suppressed. Therefore, the low band suppressing effect on the data frame part comprised of the error detecting-correcting code decreases to a great degree in the data sequence.

FIG. 3 show by way of example a data frame arranged in accordance with this invention. In the case of FIG. 3, the error detecting-correcting code of FIG. 1 is divided into an "n" number and is dispersively arranged as shown in the drawing. One method for obtaining this data frame is as follows: The check matrix H has the leftmost end thereof correspond to the MSB side of the code word. To have a code arranged in such a frame as shown in FIG. 3, therefore, the matrix H is rearranged into another matrix H', wherein columns corresponding to the check digits shown in FIG. 3 are dispersively allocated to become a part of the unit matrix within the matrix H. The matrix H' is obtainable by just applying an elementary row operation to the matrix H. The matrix H' thus obtained of course remains within the same code system as the matrix G.

In the case of the above-stated cyclic Hamming code (15, 11), for example, let us assume that the check digits are dispersively allocated at 4th, 8th, 12th, and 15th bits from the left end of the code word. In this instance, the code word arrangement becomes as shown in FIG. 4.

The elementary row operation is applied to the matrix H until the following form is obtained for the matrix H':

$$\begin{array}{c} 1\ 2\ 3\ 4\ 5\ 6\ 7\ 8\ 9\ 10\ 11\ 12\ 13\ 14\ 15 \\ H' = \begin{vmatrix} \ldots 1 \ldots 0 \ldots 0 \ldots 0 \\ \ldots 0 \ldots 1 \ldots 0 \ldots 0 \\ \ldots 0 \ldots 0 \ldots 1 \ldots 0 \\ \ldots 0 \ldots 0 \ldots 0 \ldots 1 \end{vmatrix} \end{array}$$

By this process, the matrix H' is arranged as shown below:

$$\begin{array}{c} 1\ 2\ 3\ 4\ 5\ 6\ 7\ 8\ 9\ 10\ 11\ 12\ 13\ 14\ 15 \quad (5) \\ H' = \begin{vmatrix} 0 & 1 & 1 & 1 & 1 & 0 & 1 & 0 & 1 & 1 & 0 & 0 & 1 & 0 & 0 \\ 0 & 1 & 0 & 0 & 0 & 1 & 1 & 1 & 1 & 0 & 1 & 0 & 1 & 1 & 0 \\ 1 & 1 & 0 & 0 & 1 & 0 & 0 & 0 & 1 & 1 & 1 & 1 & 0 & 1 & 0 \\ 1 & 0 & 1 & 0 & 1 & 1 & 0 & 0 & 1 & 0 & 0 & 0 & 1 & 1 & 1 \end{vmatrix} \end{array}$$

Further, a unit matrix $I_4$ is obtained by arranging together the 4th, 8th, 12th and 15th columns of the matrix H'.

Next, a matrix G' is obtained from the matrix H' in the same manner as in the case of obtaining the matrix G from the matrix H. In Formula (2) mentioned above, "$I_4$" represents the 4th, 8th, 12th and 15th columns of the matrix H' while "P" represents a $4 \times 11$ matrix consisting of the 1st, 2nd, 3rd, 5th, 6th, 7th, 9th, 10th, 11th, 13th and 14th columns in this instance.

The matrix $I_4$ which is in the dispersively allocated state as mentioned above is converted without changing the state into a matrix $I_{11}$. The divided matrix P is rearranged into a matrix $P^T$ also without any change in its state. By putting these matrixes $I_{11}$ and $P^T$ together, the matrix G' is obtained as shown below:

$$\begin{array}{c} 1\ 2\ 3\ 4\ 5\ 6\ 7\ 8\ 9\ 10\ 11\ 12\ 13\ 14\ 15 \\ G' = \begin{vmatrix} 1 & 0 & 0 & 0 & 0 & 0 & 0 & 0 & 0 & 0 & 1 & 0 & 0 & 1 \\ 0 & 1 & 0 & 1 & 0 & 0 & 0 & 1 & 0 & 0 & 0 & 1 & 0 & 0 & 0 \\ 0 & 0 & 1 & 1 & 0 & 0 & 0 & 0 & 0 & 0 & 0 & 0 & 0 & 0 & 1 \\ 0 & 0 & 0 & 1 & 1 & 0 & 0 & 0 & 0 & 0 & 0 & 1 & 0 & 0 & 1 \\ 0 & 0 & 0 & 0 & 0 & 1 & 0 & 1 & 0 & 0 & 0 & 0 & 0 & 0 & 1 \\ 0 & 0 & 0 & 1 & 0 & 0 & 1 & 1 & 0 & 0 & 0 & 0 & 0 & 0 & 0 \\ 0 & 0 & 0 & 1 & 0 & 0 & 0 & 1 & 1 & 0 & 0 & 1 & 0 & 0 & 1 \\ 0 & 0 & 0 & 1 & 0 & 0 & 0 & 0 & 0 & 1 & 0 & 1 & 0 & 0 & 0 \\ 0 & 0 & 0 & 0 & 0 & 0 & 0 & 0 & 1 & 0 & 0 & 1 & 1 & 0 & 0 & 0 \\ 0 & 0 & 0 & 1 & 0 & 0 & 0 & 1 & 0 & 0 & 0 & 0 & 0 & 1 & 0 & 1 \\ 0 & 0 & 0 & 0 & 0 & 0 & 0 & 1 & 0 & 0 & 0 & 1 & 0 & 1 & 1 \end{vmatrix} \end{array}$$

Like in the case of the matrix G, the divided matrix parts $I_{11}$ (1st, 2nd, 3rd, 5th, 6th, 7th, 9th, 10th, 11th, 13th and 14th columns) within the matrix G' correspond to the information digits of the code word. The arrangement of a code word which is obtained from the matrix G' becomes as shown in FIG. 4, wherein the check digits for detecting and correcting an error are dispersively arranged. Further, for this code word, a check matrix obtained from either of the matrixes H' and H likewise permits detection and correction of errors. Both the code words obtained from the matrix G and from the matrix G' remain within the same code system.

This invention is practiced to add, for example, a code for detecting and correcting an error by using the generation matrix G' which is arranged as mentioned in the foregoing. FIG. 5 shows in outline the arrangement of the recording system of a digital VTR to which this invention is applied as a first embodiment thereof. Referring to FIG. 5, incoming digital data is supplied to a mapping coding circuit 1. The circuit 1 processes the incoming digital data into a mapping code to suppress thereby the low band frequency component of the data. The coded digital data is supplied to a temporary storage circuit 3 according to control pulses which are generated by a control pulse generator 2 and applied to the circuit 1 in such a manner as to cause one code word portion of the coded digital data (a predetermined quantity) to be supplied to the circuit 3 at a time. The control pulses are arranged to rise for each code word in synchronism with clock pulses which are generated from a clock pulse generator 4 and are arranged to be inverted for every bit.

The control pulses are also supplied to an address control circuit 5. The circuit 5 is arranged to generate an address control signal A which changes address designation from one address to another for generation data stored on a memory table 6 every time the rise of the control pulses is detected.

At the memory table 6, the above-stated generator matrix G' is stored as the generation data. An address is added to every generation data column corresponding to each column of the generator matrix G'. An address is designated by the address control signal A. A generation column corresponding to the designated address is supplied to a multiplier 7. The multiplier 7 is arranged to receive from the temporary storage circuit 3 one code word portion of the digital data which has been changed into a mapping code and stored at the circuit 3. The multiplier 7 performs a multiplying operation on the one code word portion of data and the generation data column. The multiplier 7 is a multiplier of GF (2). The multiplied data thus obtained is supplied to an adder 8 to be added on for every column. The adder depends on the GF (2).

The data added is stored at a memory 9 for every column. With the data stored in each column of the memory 9, an address control circuit 10 applies an address control signal B to the memory 9 designating an address corresponding to each column of the memory 9. With the signal B applied to the memory 9, the data is read out for each column at a time from the memory 9. The data read out from the memory 9 is recorded on a tape at a recording part 11.

Figure 6:
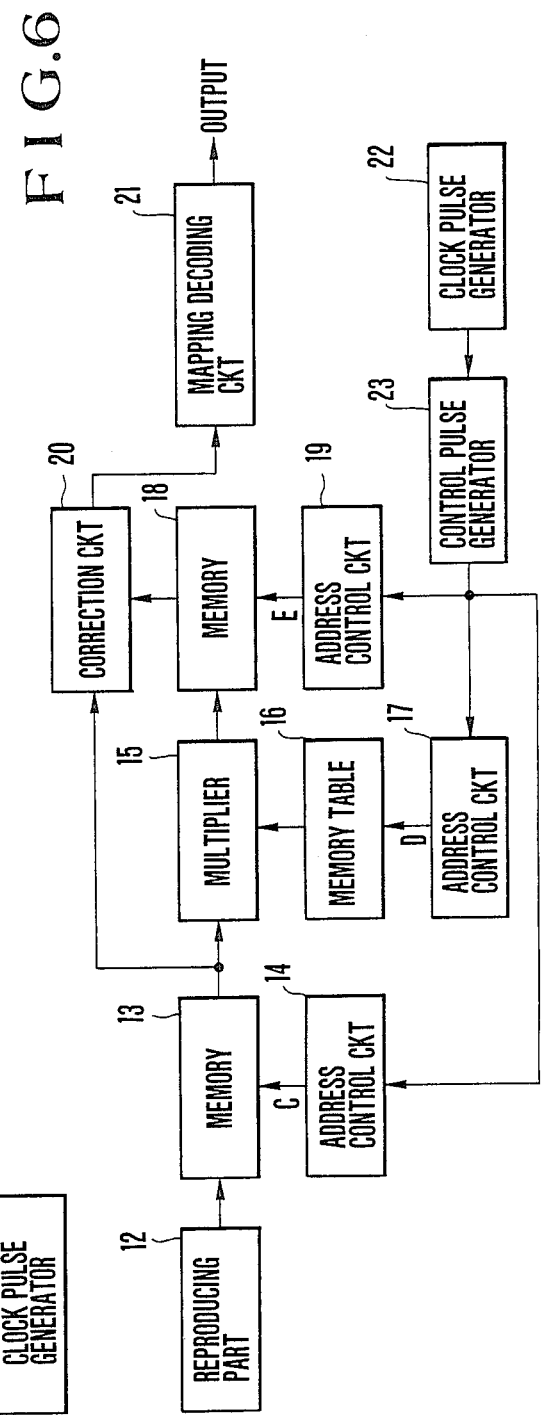
FIG. 6 is a block diagram showing in outline the arrangement of the reproducing system of the digital VTR of FIG. 5.

FIG. 6 shows in outline the arrangement of the reproducing system of the digital VTR to which this invention is applied. Referring to FIG. 6, reproduced data which is obtained at a reproducing part 12 is temporarily stored at a memory 13. An address control circuit 14 generates an address control signal C for designating an address which is added to every code word. With this signal C applied to the memory 13 designating the address, the reproduced data is read out from the memory 13 and is then supplied to a multiplier 15. The multiplier 15 is receiving backward generation data which is produced from a memory table 16. At the memory table 16, a check column H' which corresponds to the generator matrix G' is stored with an address added to every check data corresponding to each column of the check matrix H'. With an address designated by the address control signal C generated from the address control circuit 17, a check data column which corresponds to this address is supplied to the multiplier 15.

The multiplier 15 performs a multiplying operation on the reproduced data and the check data. The result of this operation is stored at a memory 18. Through this process, in accordance with the address designated by another address control signal E which is generated by an address control circuit 19, the data stored at the memory 18 is read out from the memory 18 to be supplied to a correction circuit 20.

In the event of a single error, for example, the data stored at the memory 18 is in the same pattern as column data corresponding to the error position of the check matrix H'. In the event of a plurality of errors, the pattern of the stored data represents a linear combination of a plurality of column data corresponding to the error positions. The position and the size of the error then can be detected and corrected according to the result of the computing operation.

At the correction circuit 20, an adding operation is performed on the reproduced data and the computed size of the error with the latter added to the error position of the former, so that correctly reproducted data can be produced from the circuit 20.

The output of the circuit 20 is supplied to a mapping decoding circuit 21 which is arranged to perform conversion in a manner reverse to the mapping coding circuit 1 shown in FIG. 5. The decoded data thus obtained is produced as a reproduction output in the same form as that of the incoming data of FIG. 5.

The address control signals C, D and E which are produced from the address control circuit 14, 17 and 19 are arranged to be generated on the basis of a control pulse signal which is generated from a control pulse generator 23 in synchronism with clock pulses generated by a clock pulse generator 22.

Figure 7:
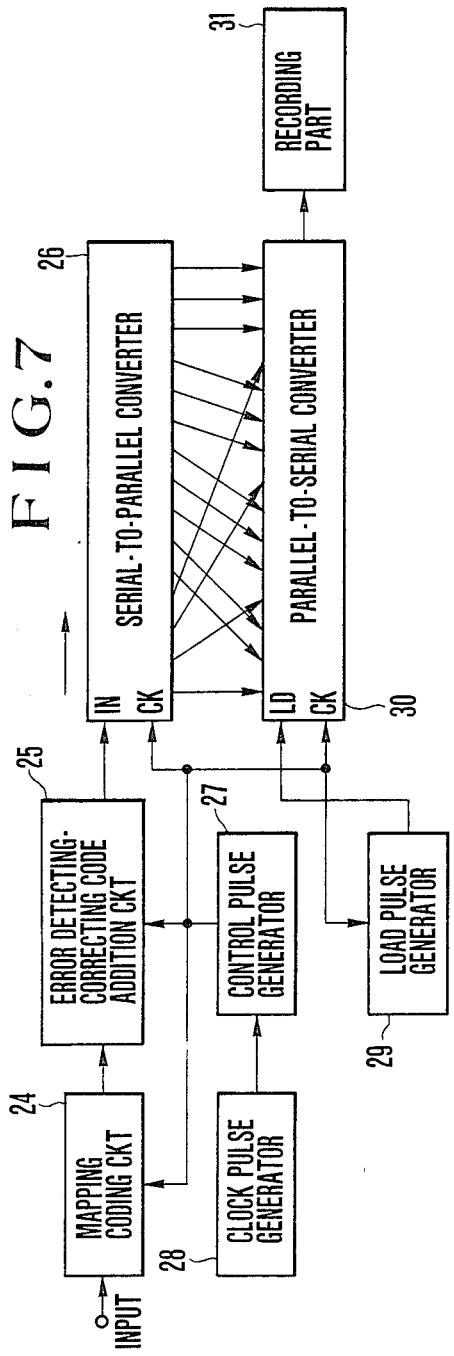
FIG. 7 is a block diagram showing in outline the arrangement of the recording system of a digital VTR to which this invention is applied as a second embodiment of this invention.

FIG. 7 shows in outline the arrangement of a digital VTR embodying this invention as a second embodiment thereof. Referring to FIG. 7, incoming digital data is supplied to a mapping coding circuit 24 to be mapping coded there. The low band frequency component of the incoming data is suppressed by this coding process. The coded data is supplied to an error detecting-correcting code addition circuit 25. The circuit 25 adds an error detecting and correcting code to the coded data to change it into the form as shown in FIG. 1. Then, each one-code-word portion of data thus obtained is supplied to a serial-to-parallel converter 26 to be temporarily stored there. These processes are performed in synchronism with control pulses generated by a control pulse generator 27. The pulses generated by the generator 27 are arranged to rise for every code word in synchronism with clock pulses which are generated by a clock pulse generator 28 and are inverted for every bit. The control pulses are supplied also to a load pulse generator 29. The load pulse generator 29 then generates load pulses in synchronism with the rise of the control pulses. The load pulses are supplied to a parallel-to-serial second converter 30.

Upon detection of the rise of the load pulses, the parallel-to-serial converter 30 receives from the serial-to-parallel converter 26 the one-code-word portion of data which is stored at the converter 26 in the form of data frame as shown in FIG. 1.

The serial-to-parallel converter 26 and the parallel-to-serial converter 30 are interconnected, as by conductors, in such a manner that, at the time of the above-stated transfer of data, the data frame arrangement of FIG. 1 is rearranged into the data frame arrangement as shown in FIG. 3. Therefore, after the transfer, the output of the parallel-to-serial converter 30 is in the form of a data frame which is arranged as shown in FIG. 4 with the error detecting-correcting code dispersively arranged therein.

The data which is thus produced from the parallel-to-serial converter 30 is recorded on a tape at a recording part 31.

Figure 8:
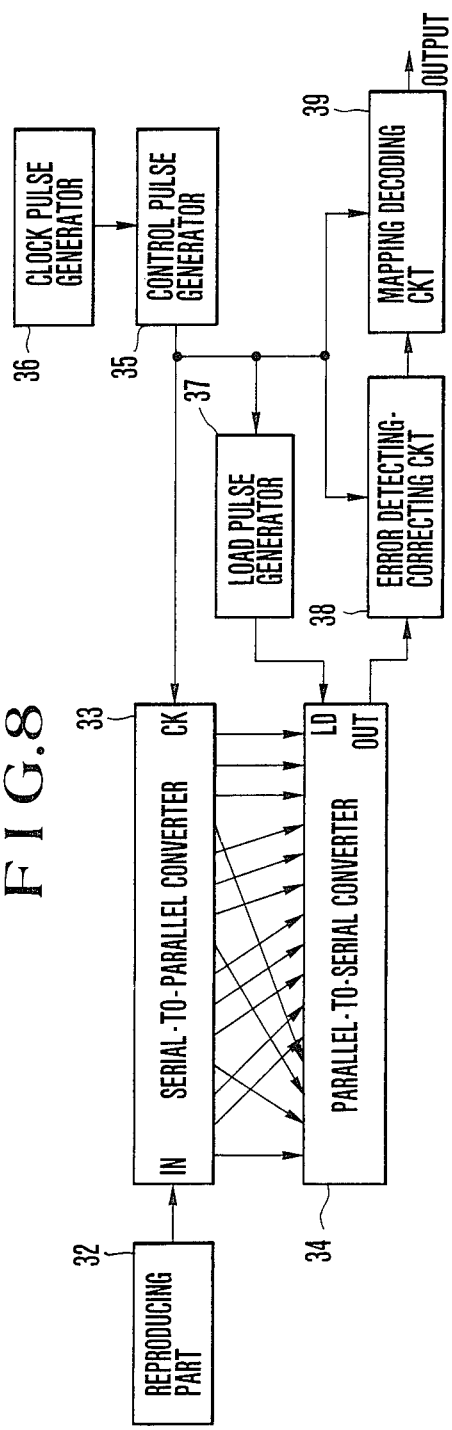
FIG. 8 is a block diagram showing in outline the arrangement of the reproducing system of the VTR of FIG. 7.

FIG. 8 shows in outline the arrangement of the reproducing system of the same digital VTR embodying this invention. Referring to FIG. 8, data reproduced by a reproducing part 32 is supplied to a serial-to-parallel converter 33 for one code word at a time. The one-cord-word portion of data which is read into the serial-to-parallel converter 33 is transferred to a parallel-to-serial converter 34. The converters 33 and 34 are interconnected in such a way as to convert, through the transfer, the data from the frame arrangement of FIG. 3 into the frame arrangement of FIG. 1. The data reading into the serial-to-parallel converter 33 is performed under the control of control pulses generated by a control pulse generator 35. The control pulses are generated in synchronism with clock pulses which is generated by a clock pulse generator 36 and is inverted for every bit. The control pulses are thus arranged to rise for every code word. The reproduced data is read into the serial-to-parallel converter 33 in synchronism with the rise of the control pulses.

The transfer of data from the converter 33 to the parallel-to-serial converter 34 is performed in synchronism with load pulses generated from a load pulse generator 37. The load pulses are arranged to rise in synchronism with the rise of the control pulses. The rise of the load pulses causes the data to be read into the parallel-to-serial converter 34 from the serial-to-parallel converter 33. The data which is thus transferred with its data frame changed is supplied to an error detecting-correcting circuit 38 to have its error detected and corrected there upon detection of the next rise of the load pulses. An error corrected signal or data thus obtained is supplied to a mapping decoding circuit 39 to be mapping decoded. The decoded data thus obtained is produced as a digital data output.

As will be understood from the above description, in the case of the second embodiment, the data frame arrangement can be converted into another frame arrangement without recourse to any complex circuit arrangement. The simple circuit arrangement permits inclusion thereof into an encoding circuit or a decoding circuit in the form of an integrated circuit without difficulty. It is another advantage of this embodiment that, since interconnection of the serial-to-parallel and parallel-to-serial converters is readily variable, the arrangement of this embodiment permits the data frame arrangement to be changed into any frame arrangement other than those frame arrangements described.

In accordance with this invention, as described in the foregoing, a digital VTR can be simply arranged to be capable of attaining a high degree of low band frequency component suppressing effect.

Figure 10:
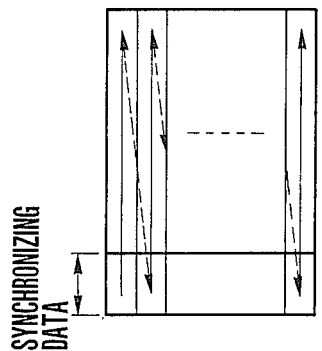
FIG. 10 is an illustration of a manner in which the product code which is arranged as shown in FIG. 9 is transmitted.

An embodiment of this invention wherein a product code is employed as the error detecting-correcting code is arranged as described below:

FIG. 9 shows an example of a product code arranged according to this invention. FIG. 10 shows with arrows the time base directions in which the product code arrangement of FIG. 9 is transferred. After completion of transfer of all data from the synchronizing data to the inner code check digit within one data frame, a data frame of a next row is transferred. An outer code check digit which is provided as check digit for each column is coded for each of the columns as shown in FIG. 2. However, with the position of the outer code check digit arranged to vary obliquely as shown in FIG. 9 for every column, the check digits can be prevented from becoming excessively continuous when the data is transferred in a manner as shown in FIG. 10.

Figure 11:
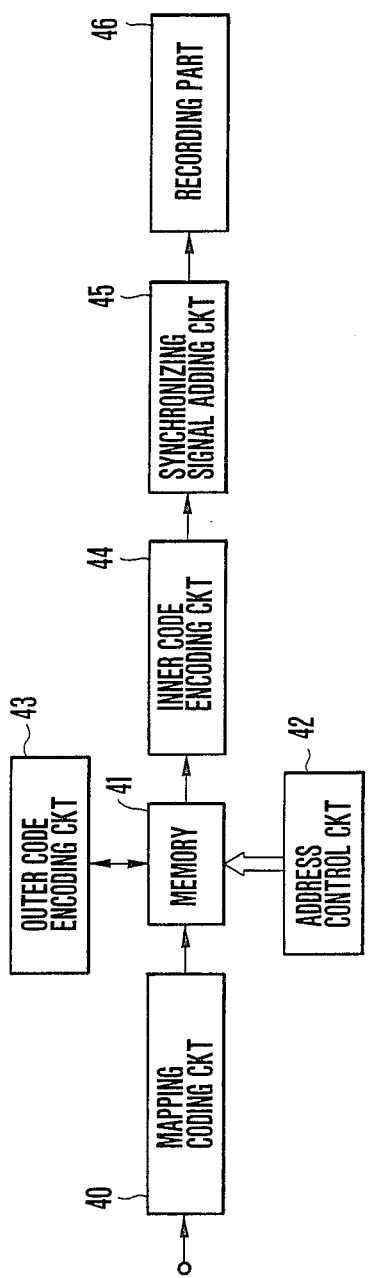
FIG. 11 is a block diagram showing in outline the arrangement of the recording system of a digital VTR to which this invention is applied as a third embodiment thereof.

FIG. 11 shows in outline the arrangement of the recording system of a digital VTR embodying this invention as a third embodiment thereof. Incoming digital data is supplied word by word to a mapping coding circuit 40. The digital data is mapping coded to thus have the low band frequency component thereof suppressed. The mapping coded digital data is temporarily stored at a memory 41. At the memory 41, the digital data is written in a state of excluding the synchronizing data part thereof which is as shown in FIG. 10. When a portion of data corresponding to a "k" number of words of one stage is stored one after another sidewise from an upper left part, a next k word portion of data is written in from the left end to the right end of a next stage located below the first stage. The writing in operation is performed for a total of an "l" number of stages one after another. In carrying out this writing in operation, an address control circuit 42 is arranged to generate signals representing column addresses k and signals representing line address l one after another when its output becomes synchronous with the incoming data.

Following this, an outer code encoding circuit 43 operates to add outer code check digits in the following manner: In the case of the conventional arrangement which is as shown in FIG. 2, a computing operation is performed on the vertical column of the information data and the check digits are added to the same column. The coding process is performed, for example, from the leftmost column one after another. For some of the columns, data is read into the outer code encoding circuit 43 from the uppermost data one after another with computation before a check digit is written into the lowermost part of the column. Whereas, in the case of this embodiment of this invention, the encoding starting point of one column is arranged to differ from another column in such a manner as to have the outer code check digits allocated in the manner as shown in FIG. 9. Accordingly, the address control circuit 42 is arranged to generate address signals in such a manner as to vary the starting point for every column and to have the outer code check digits allocated as shown in FIG. 9. This operation will be further described later herein.

With the data arranged to have the outer code check digits obliquely allocated as shown in FIG. 9, the data is read out sidewise. Then, an inner code encoding circuit 44 adds an inner code digit point to each of rows of data which are thus read out sidewise. Further, a synchronizing signal adding circuit 45 adds synchronizing data to each row of data. After that, the data is recorded on a tape which is not shown at a recording part 46.

The details of the address control circuit 42 are as follows: FIG. 12 shows by way of example the arrangement of the address control circuit 42 of FIG. 11. A clock pulse generator 92 is arranged to generate outer code reading/writing word clock pulses. These clock pulses are supplied to a row counter 47 and a column counter 48. Each of these counters is arranged to up count every time it receives one clock pulse from the generator 92. The row counter 47 is an l-adic counter and the column counter 48 a k-adic counter. A reference numeral 49 denotes a carry output produced from the row counter 47. The counter output of the column counter 48 is inverted by an inverter 50 and is added up together with the counter output of the row conter 47 at an adder 51. As a result, the adder 51 produces a value which is obtained by subtracting the counted value of the column counter 48 from the counted value of the row counter 47. The output of the adder 51 is supplied to a computing element 52. Then, a row address which is of a value between 0 and $(l-1)$ is obtained at the computing element 52.

Further, the slanting direction of the obliquely allocated outer code check digits can be reversed by not using the inverter 50 which is arranged to invert the output of the column counter 48 (or a column address output) as mentioned above. The inclination of the oblique allocation is adjustable by adding some constant to the adder 51.

FIG. 13 shows in outline the arrangement of the reproducing system of the same digital VTR arranged to reproduce information recorded on a tape by the recording system shown in FIG. 11. Referring to FIG. 13, a reproducing part 53 reproduces a recorded signal from the tape which is not shown. A synchronizing signal separating circuit 54 then separates synchronizing data from the reproduced signal. Then, each data column excluding the synchronizing data is supplied to an inner code error detecting-correcting decoding circuit 55.

The inner code error detecting-correcting decoding circuit 55 is arranged to detect an error of the serially incoming data by using an inner code and to correct the error thus detected. The data which is thus corrected is stored at a memory 56.

The memory 56 is arranged to write in the data in the same manner as the memory 41 of FIG. 11. The writing in operation is controlled by an address control circuit 57.

The data thus stored at the memory 56 is read out column by column by the address control circuit 57 and is supplied to an outer code error detecting-correcting decoding circuit 58. The circuit 58 detects and corrects any error of the column of data read out from the memory 56 by using an outer code. After completion of the error detection and correction with the outer code, the data is again stored at the same memory 56. As mentioned in the foregoing, the outer code check digits are allocated, for example, in a manner as shown in FIG. 9. However, since the location of each outer code check digit is determined during recordig, the data which is stored at a specific address on the memory 56 is the data of the outer code. Therefore, the data of the outer code is never mistaken for other data in reading it out.

With the data stored at the memory 56 after completion of error detection and correction with the inner and outer codes as mentioned above, reading addresses are controlled by the address control circuit 57 to have the stored data read out row by row. The data thus read out is supplied to a mapping decoding circuit 59 to be decoded into reproduced picture data.

In this specific embodiment, the mapping coding circuit is employed as low band frequency component suppressing means. However, the use of the mapping coding circuit may be replaced with use of any other coding circuit that gives a low band frequency component suppressing effect, such as a block coding circuit for example. The use of such other coding circuit may further improve the low band suppressing effect.

Further, in this embodiment, this invention is applied to a digital VTR. However, the invention is not limited to digital VTR's but is applicable also to other apparatuses such as data communication apparatuses, disc recording/reproducing apparatuses, etc.

In accordance with this invention, as described in the foregoing, a high degree of low band frequency component suppressing effect can be attained for a digital VTR using a product code for error detection and correction.

Figure 14:
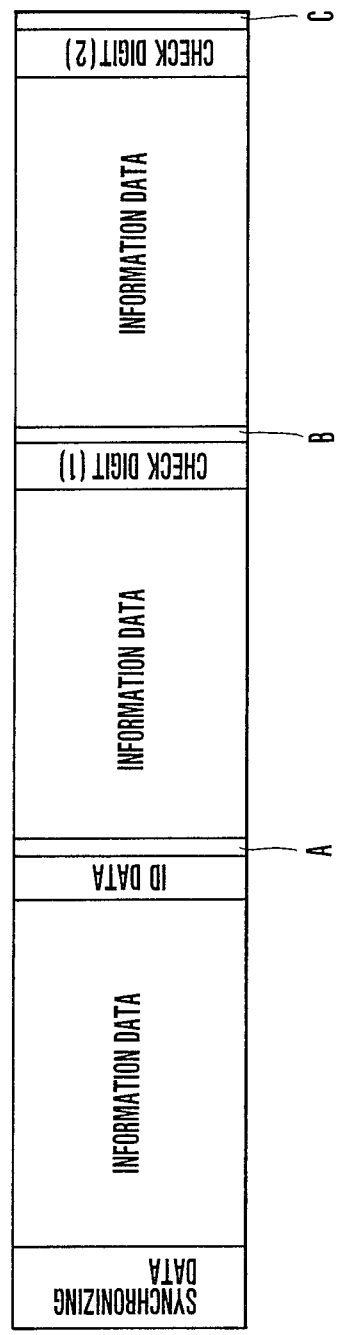
FIG. 14 is an illustration showing by way of example a data frame arranged according to this invention.

A fourth embodiment of this invention is arranged as described below:

FIG. 14 shows an example of data frame arrangement according to this invention. In FIG. 14, each part indicated as "information data" represents a data sequence which has been mapping coded. The information data or the mapping coded data sequence consists of 128 bits (or 16 words). Synchronizing data, ID data, a check point (1) and another check point (2) are added to the mapping coded data sequence as additional information. The synchronizing data is arranged to be of a data pattern in which the value DSV becomes zero. In this case, for example, a data pattern of 16 bits such as "11110000 11110000" or "0000111100001111" is employed.

Meanwhile, each of the ID data, the check digit (1) and the check digit (2) is arranged to be of data of eight bits. The ID data serves as an address data or the like for the data sequence. The check digits (1) and (2) are data provided for detecting and correcting errors and may be considered to be in any random data pattern. Such data cannot be mapping coded. Therefore, the low band frequency component suppressing effect becomes lower on the parts wherein the ID data and the check digits (1) and (2) are located.

To solve this problem, in accordance with this invention, one bit is provided for DSV control in each of positions A, B and C as shown in FIG. 14. The DSV control bits are generated in the following manner:

Referring to FIG. 14, the DSA control bit in the position or point A is generated as follows: Let us first consider two different data sequences. In one data sequence, "1" is inserted as data before NRZI (non-return to zero inverse) modulation for the DSV control bit of the point A. In the other data sequence, "0" is likewise inserted instead of "1". The NRZI modification is applied to the two different data sequences (data sequence preceding the point A has already been determined). After this, the cumulative value of DSV of NRZI modulated data porton up to a point immediately before the DSV control bit in the position B is computed for each of the two different data sequences. After computation, the cumulative value of DSV obtained with the DSV control bit in the position A being at "1" and the cumulative value of DSV obtained with the DSV control bit at "0" are compared with each other. Then, the data sequence having the DSV cumulative value closer to zero is selected and produced. In other words, between two different DSV control bits of the position A, the bit that gives the DSV cumulative value closer to zero is employed.

Following that, the value of the DSV control bit in the position B is likewise determined on the basis of a DSV cumulative value obtained from a portion of data sequence up to a part immediately before the DSV control bit in the position C. All the DSV control bits are thus determined one after another.

During reproduction, the data sequence is processed to have the NRZI signal decoded into an NRZ (non-return to zero) signal. Then, data of the DSV control bit positions which are computed from the position of the synchronizing data already detected are extracted from the data sequence. After extraction, the data sequence is subjected to a subsequent signal processing operation.

Figure 15:
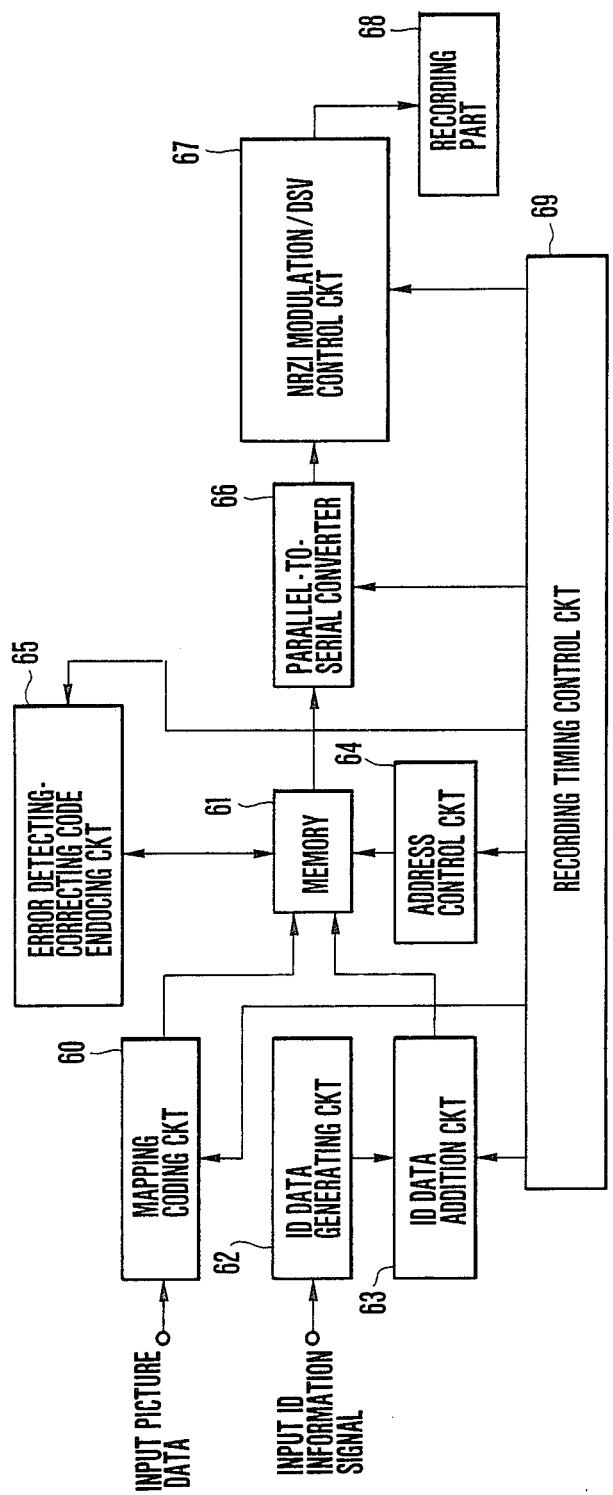
FIG. 15 is a block diagram showing in outline the arrangement of the recording system of a digital VTR to which this invention is applied as a fourth embodiment thereof.

FIG. 15 shows in outline the arrangement of the recording system of a digital VTR to which this invention is applied as a fourth embodiment thereof. Incoming picture data is processed at a mapping coding circuit 60 into data of 128 bits to have the low band frequency component thereof thus suppressed. The data is supplied to a memory 61 to be temporarily stored there. At the same time, an ID information signal is supplied to an ID data generating circuit 62 to be converted into ID data of eight bits there. The ID data is supplied via a ID data addition circuit 63 to the same memory 61 to be also stored there. The ID addition circuit 63 is arranged to add an address data to the ID data in such a way as to have the ID data stored in an area within the memory 61 corresponding to an area in which the picture data is stored. The picture data and the ID data which are thus stored at the memory 61 are read out according to an address control signal generated from an address control circuit 64. The data which is thus read out from the memory 61 is supplied to an error detecting-correcting code encoding circuit 65. At the circuit 65, error detecting-correcting code check digit data (the check digits (1) and (2) mentioned in the foregoing) of eight bits is added to the data. Then, the data is again stored at the memory 61. The stored data is again read out according to the address control signal and is then supplied to a parallel-to-serial converter 66 to be converted into a serial data of a total of 136 bits.

The converted data is NRZI modulated at an NRZI modulation/DSV control circuit 67 and a DSV control bit is added to the data. After completion of these processes, the data is recorded at a recording part 68 on a tape which is not shown. With the 136 bits of the data arranged in one block, one DSV control bit is added to each of the data blocks. Further, the operation described above is performed under the control of a recording timing control signal generated from a recording timing control circuit 69.

FIG. 16 shows in outline the arrangement of the reproducing system of a digital VTR arranged to reproduce information recorded on the tape by the recording system shown in FIG. 15. Referring to FIG. 16, a reproduced NRZI signal reproduced from the tape which is not shown is demodulated into an NRZ signal at an NRZI demodulating circuit 71. A synchronizing signal detecting circuit 72 detects a synchronizing signal contained in the demodulated signal. The detected synchronizing signal or data is separated at a snychronizing signal separating circuit 73. With the synchronizing data thus excluded, the rest of the data sequence of 137 bits is converted into parallel data by a serial-to-parallel converter 74. At the same time, the DSV control bit is removed and the total number of bits of the data becomes 136. The data is then temporarily stored at a memory 75. Then, the stored data is read into an error detecting-correcting decoding circuit 77 in accordance with an address control signal generated by an address control circuit 76. The circuit 77 detects and corrects any error of the data. Upon completion of it, the corrected data is again stored at the memory 75. Further, at the memory 75, the picture data and the ID data are stored separately from each other. These separately stored data are read out again according to the address control signal and are supplied respectively to a mapping decoding circuit 78 and an ID data converting circuit 79. The circuits 78 and 79 then decoded and convert these inputs and produce reproduced picture data and a reproduced ID information signal respectively. The operation described above is performed under the control of a reproduction timing control signal which is generated at a reproduction timing control circuit 80.

Figure 17:
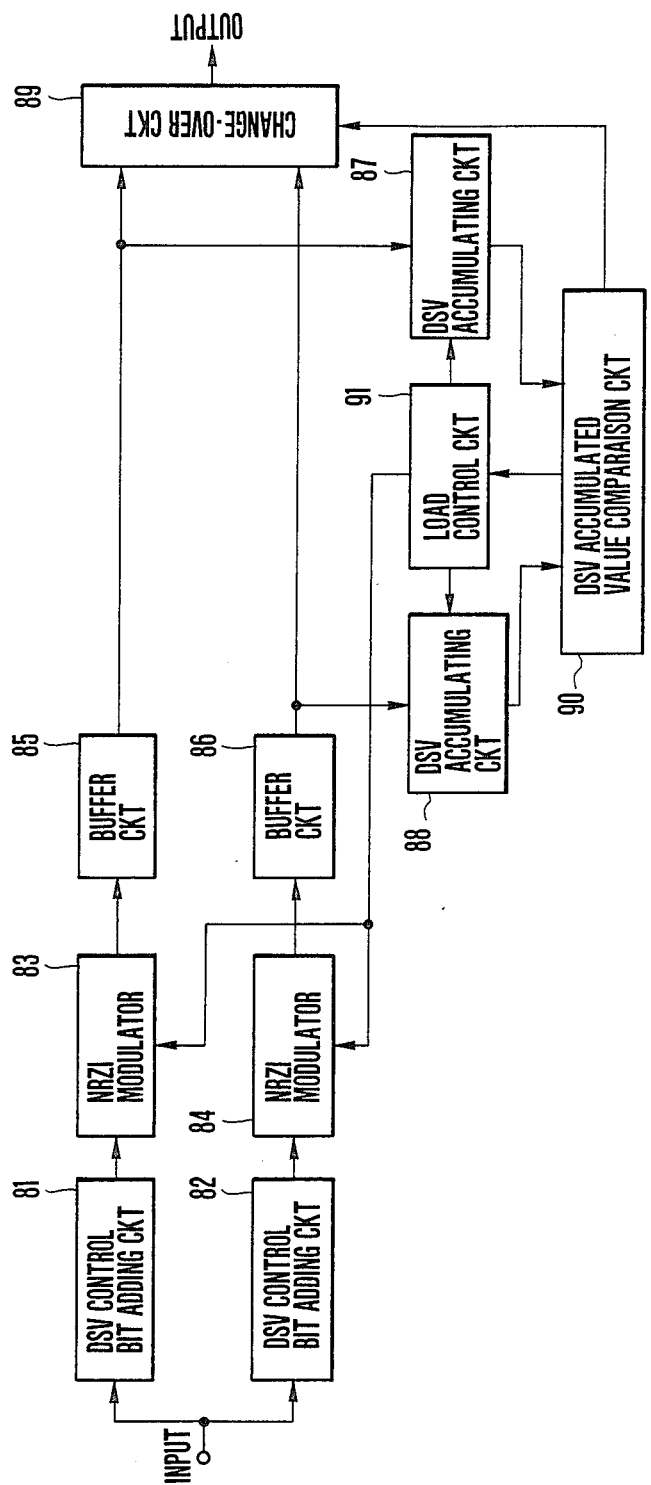
FIG. 17 is a block diagram showing by way of example the arrangement of an NRZI modulation/DSV control circuit 67 included in the VTR of FIG. 15.

FIG. 17 is a block diagram showing the details of the NRZI modulation/DSV control circuit 67 of FIG. 15. Referring to FIG. 17, incoming data is arranged in the form of blocks, each consisting of 136 bits, by the parallel-to-serial converter 66 of FIG. 15.

Next, the incoming data sequence is supplied to DSV control bit adding circuits 81 and 82. At the circuits 81 and 82, "1" and "0" are added to the data in the position of the DSV control bit respectively to obtain two different data sequences.

The data sequences, one having "1" and the other "0" in the DSV control bit position respectively, are supplied to NRZI modulators 83 and 84. Then, as a result of addition of different DSV control bits, the data patterns of the data sequences thus modulated into NRZI signals come to be in a converse relation with each other.

The NRZI modulated data are supplied to buffer circuits 85 and 86. The outputs of these circuits 85 and 86 are supplied to DSV accumulating circuits 87 and 88 and also to a change-over circuit 89. Each of the DSV accumulating circuits 87 and 88 is arranged to measure the accumulating value of DSV of the incoming data and to supply the result of measurement to a DSV accumulated value comparison circuit 90. The circuit 90 makes a discrimination to find which of the two accumulated values received is closer to zero and produces a change-over control signal. This signal is supplied to the change-over circuit 89 to cause the circuit 89 to produce one of the two data having its accumulated value closer to zero than that of the other.

Concurrently with the generation of this change-over control signal, the DSV accumulated value comparison circuit 90 also produces and supplies a reset signal to a load control circuit 91. Upon receipt of the reset signal, the load control circuit 91 controls the DSV accumulating circuits 87 and 88 to preset the value of these circuits 87 and 88 at the accumulated value of the selected data and also controls the NRZI modulators 83 and 84 to cause the output levels of these modulators 83 and 84 to become equal to the output level of the NRZI modulator which produced the data selected.

In this embodiment, in dividing the mapping coded data into blocks, each block is formed with 136 bits. One bit for DSV control is then added to every block of data. The number of bits forming one block is, however, not limited to 136. The number of bits may be increased to reduce the degree of redundancy resulting from the addition of the DSV control bit without much lowering the low band frequency component suppressing effect. While the mapping coding circuit is employed as the low band frequency component suppressing means, any other coding circuit such as a block coding circuit, that has a low band frequency component suppressing effect may be used in place of the mapping coding circuit in accordance with this invention. With a suitable coding circuit employed for that purpose, the low band frequency component suppressing effect may be attained to a greater degree.

Further, the NRZI converter is employed as converting means in the embodiment described. However, the NRZI converter may be replaced with any other converting means that gives a signal permitting control over a difference between the number of data of "0" and that of data of "1" among the second and subsequent bits according to the data content of the first bit. A modulator for modulation into a Miller code, a Miller square code, or the like may be employed for that purpose. With such other converting means arranged according to this invention, the effect attainable by its modulation method may be further enhanced.

In the embodiment described, this invention is applied to a digital VTR. However, this invention is not limited to the digital VTR but is applicable also to data transmission, recording on a disc and other purposes.

In accordance with this invention, as apparent from the foregoing description, a low frequency band component suppressing effect is attainable to a high degree without excessively increasing the degree of redundancy with simple arrangement of a digital VTR or the like.

What is claimed is:

1. A data transmission system for transmitting information data, comprising:
    a. input means for receiving said information data and arranging such received data in separate signal groupings of predetermined data quantity;
    b. error detecting-correcting data generating means for receiving such information data signal groupings and for generating an error detecting-correcting data signal grouping in correspondence with each said information data signal grouping; and
    c. error detecting-correcting data dispersing means for receiving said information data signal groupings and said error detecting-correcting signal groupings, for dividing corresponding such signal groupings into segments, and for dispersing the error detecting-correcting segments into the information data signal segments of said corresponding signal groupings, and thereby producing signals for transmission which thereby have a suppressed low band frequency component.

2. A system according to claim 1, wherein said error detecting-correcting data generating means divides said information data signal groupings at every m number of data thereinto provide row data signals and includes a row data error detecting-correction data generating circuit which generates row data error detecting-correcting data signals for every row data by treating said m number of bits of information data as row data.

3. A system according to claim 2, wherein said error detecting-correcting data dispersing means includes a serial-to-parallel first converter which serially receives said row data signals with corresponding such data error detecting-correcting data signals and produces parallel output signals; and a parallel-to-serial second converter; and conductor means for applying said first converter output signals to said second converter in manner effecting such dispersion.

4. A system according to claim 1, wherein said error detecting-correcting data generating means divides said information data signal groupings at ever m number of bits any, by treating said m number of bits as row data, arranges said row data in an n number of vertical lines according to their incoming sequence thus forming n number of bits of information data into column data with all said row data arranged in equal bit positions; and further includes a column data error detecting-correcting data generating circuit which is arranged to generate error detecting-correcting data for each of said column data.

5. A system according to claim 4, wherein said column data error detecting-correcting data generating circuit includes a storage circuit which is arranged to store a consecutive n number of said row data; and an error detecting-correcting data adding circuit which is arranged to read, from said storage circuit, data located in the same bit position in each of said n number of data, to produce the data thus read out as an m number of information data each consisting of an n number of bits, to obtain the information data of said n number of bits as column data and to add error detecting-correcting data to the rearmost part of each column data for said m number of column data obtained.

6. A system according to claim 5, wherein said error detecting-correcting data dispersing means includes an information data reading control circuit which is arranged such that the bit included in each of said column data is read out from said storage circuit in a different sequence from those of other column data in such a way as to have said added error detecting-correcting data not come to adjoin other added error detecting-correcting data when said column data are aligned side by said with said error detecting-correcting data added thereto by said error detecting-correcting data adding circuit and that the column data thus read out are supplied to said error detecting-correcting data adding circuit.

7. A data transmission system for transmitting information data, comprising:
    a. input means for receiving said information data and arranging such received data in separate signal groupings of predetermined data quantity;
    b. generating data generating means for receiving such information data signal groupings and for generating generator matrix data to be used for adding error detecting-correcting data signal groupings correspondingly to said information data signal groupings,; and
    c. computing means for producing signals for transmission having a suppressed low band frequency component by performing a computing operation on said information data signal groupings and the generator matrix data generated by said generator matrix data generating means, whereby such signals for transmission have said error detecting-correcting signal groupings dispersed in corresponding information data signal groupings.

8. A system according to claim 7, wherein said generator matrix data generating means includes a storage circuit which stores said generator matrix data.

9. A system according to claim 7, wherein said input means provides such information data signal groupings each with an m number of bits.

10. A system according to claim 9, wherein said generator matrix data generating means provides generator matrix data consisting of an n×m number of bits arranged by aligning sidewise an n number of columns of generation column data, each column consisting of an m number of bits.

11. A system according to claim 10, wherein said computing means includes a multiplication circuit which is arranged to multiply each bit of the information data of said m number of bits received from said input means by the n number of generator matrix data of said m number of bits included in said generator matrix data generated by said generator matrix data generating means and to produce multiplication data of n×m bits obtained with the multiplication column data of the m number of bite aligned sidewise in the form of an n number of columns; and an addition circuit arranged to perform an adding operation on each column of said multiplication data of n×m bits produced from said multiplication circuit.

12. A data transmission system for transmitting information data, comprising:
   a. input means for receiving said information data and arranging such received data in separate signal groupings of predetermined data quantity;
   b. error detecting-correcting data generating and adding means for receiving such information data signal groupings, for generating error detecting-correcting signal groupings corresponding to said informational data signal groupings, and for dispersively adding said error detecting-correcting signal groupings to corresponding information data signal groupings to therby produce signals for transmission having a suppressed low band frequency component;
   c. transmission means for transmitting such produced signals; and
   d. error detecting and correcting means for detecting and correcting errors in such transmitted produced signals by using such dispersed error detecting-correcting signal groupings.

13. A system according to claim 12, wherein said transmission means includes a recording device for recording on a recording medium said produced signals; and a reproducing device for reproducing said information data from such recorded produced signals.

14. A system according to claim 12, wherein said error detecting and correcting means includes a serial-to-parallel first converter which serially receives the information data signal groupings with said corresponding error detecting-correcting data signal groupings and to produce said serially received data in parallel; and a parallel-to-serial second converter which receives said data from said serial-to-parallel converter; and conductor means for applying said first converter output signals to said second converter in manner effecting such dispersive adding.

15. A data transmission system for transmitting information data, comprising:
   a. information data allocating means arranged to receive said information data in separate signal groupings of predetermined data quantity, to divide each such information data signal grouping into groups, each group consisting of an m number of sequential data, and, by treating m bits of information data as row data, to vertically allocate an n number of row data in their incoming sequence with the bit position of one row aligned with that of another row;
   b. error detecting-correcting data generating means which is arranged to receive, as column data, an n number of data located in the same bit position within the information data allocated by said information data allocating means, to generate error detecting-correcting data for every column data and to add said error detecting-correcting data to the last part of each of said column data; and
   c. input control means which is arranged to control the incoming sequence of data within each of said column data supplied from said information data allocating means to said error detecting-correcting data generating means in such a manner that the error detecting-correcting data of one column data is located in a different position from tht of adjoining column data when said column data are arranged side by side with their bit positions aligned with each other after addition of said error detecting-correcting data to these column data by said error detecting-correcting data generating means.

16. A system according to claim 15, wherein said information data allocating means includes a storage circuit which is arranged to receive said predetermined amount of information data by dividing said data into groups of an m number of bits and, by treating the information data of said m bits as row data, to store an n number of rows of said row data one after another in their incoming sequence with their bit positions vertically aligned.

17. A system according to claim 16, wherein said input control means includes a writing control circuit which is arranged to control a data writing operation on said storage circuit.

18. A system according to claim 17, wherein said writing control circuit includes a clock signal generating circuit which generates a clock signal in synchronism with the bit period of said information data supplied to said storage circuit; an m-adic counter circuit receiving said clock signal and performing an up count in synchronism with said clock signal; an n-adic counter circuit receiving said clock signal and performing an up count in synchronism with said clock signal; and an address designating circuit which is arranged to designate writing in column and row addresses within said storage circuit according to the respective counted values of said counter circuits.

19. A data transmission system for transmitting information data, comprising:
   a. low band frequency component suppressing means which receives said information data and suppresses the low band frequency component thereof;
   b. first data adding means arranged to divide said low frequency band suppressed information data into groups, each having a predetermined amount of information, and to produce as a first information data group one of said divided groups by adding a data signal which is indicative of "0" to the head of said group;
   c. second data adding means arranged to add a data signal which is indicative of "1" to head of another of said divided information data groups and to produce said group as a second information data group;
   d. converting means for converting each of said first and second information data groups into a signal representing a difference between the number of bits indicative of "0" and the number of bits indicative of "1" among second and subsequent bits within each group, said difference being arranged to vary according to the content of a first bit within said group;

e. adding means arranged to compute a difference between the number of bits indicative of "0" and the number of bits indicative of "1" within each of said first and second information data groups after conversion by the converting means and to cumulatively add the difference between the number of bits indicative of "0" and that of data bits indicative of "1" among said information data transmitted; and f. output selection means for selecting either said first or second information data group obtained through conversion by said converting means, said selection being made according to the result of the adding operation of said adding means.

20. A system according to claim 19, wherein said converting means includes a modulation circuit which is arranged to perform a "non-return to zero inverted" modulating operation on said first and second information data groups supplied to said converting means.

21. A system according to claim 19, wherein said adding means is arranged to compute the accumulated value of said difference for each of said first and second information data groups after completion of the converting operation of said converting means, with said data indicative of "0" being processed as "−1" and said data indicative of "1" as "+1", and further to add said accumulated value of each data group thus obtained to the accumulated value of information data which has been previously transmitted.

22. A system according to claim 21, wherein said output selection means is arranged to select and produce one of said first and second information data groups converted by said converting means which has the result of addition by said adding means closer to zero than the other group.

23. A data transmission system for transmitting information data, comprising:

a. low band frequency component suppressing means which receives said information data and suppresses the low band frequency component thereof;

b. data adding means arranged to divide said low frequency band component suppressed information data into groups of a predetermined amount of information and to selectively add to the head of each of said divided groups of information data either data indicative of "0" or data indicative of "1";

c. inverting means arranged such that when the data indicative of "1" is added by said data adding means to the head of said divided information data, said inverting means inverts ensuing information data;

d. selection means arranged to accumulate a difference between the number of bits indicative of "0" and the number of bits indicative of "1" within information data already transmitted and to select said data to be added by said data adding means between data indicative of "0" and data indicative of "1" according to the accumulated value of difference thus obtained.

* * * * *